(12) United States Patent
Bierer

(10) Patent No.: US 6,617,840 B2
(45) Date of Patent: Sep. 9, 2003

(54) WIRELESS ALTERNATING CURRENT PHASING VOLTMETER

(76) Inventor: Walter S Bierer, 183 Elton Walker Rd., Blythewood, SC (US) 29016

( * ) Notice: Subject to any disclaimer, the term of this patent is extended or adjusted under 35 U.S.C. 154(b) by 0 days.

(21) Appl. No.: 09/814,993

(22) Filed: Mar. 22, 2001

(65) Prior Publication Data

US 2002/0135353 A1 Sep. 26, 2002

(51) Int. Cl.[7] .............................................. G01R 31/02
(52) U.S. Cl. ...................................................... 324/126
(58) Field of Search ......................... 340/539, 870.02, 340/870.03; 324/127, 142, 107, 96, 140 R, 140 D, 66–67, 149

(56) References Cited

U.S. PATENT DOCUMENTS

| | | | | |
|---|---|---|---|---|
| 4,257,001 A | * | 3/1981 | Partain et al. | 324/58.5 C |
| 4,288,748 A | | 9/1981 | Kaye et al. | |
| 4,709,339 A | * | 11/1987 | Fernandes | 364/492 |
| 4,793,704 A | | 12/1988 | Hagner | |
| 4,812,746 A | | 3/1989 | Dallas, Jr. | |
| 4,839,598 A | * | 6/1989 | Calvert et al. | 324/539 |
| 5,828,209 A | | 10/1998 | Janssen | |
| 6,369,719 B1 | * | 4/2002 | Tracy et al. | 340/870.02 |

* cited by examiner

Primary Examiner—Vinh P. Nguyen
(74) Attorney, Agent, or Firm—Michael A. Mann; Nexsen Pruet Jacobs & Pollard, LLC; Wm. T. Klett, III

(57) ABSTRACT

A wireless phasing voltmeter having a high impedance AC voltmeter in series with two high impedance probes. Shielding surrounds and electrically isolates the voltmeter and probes which communicate via wireless, FM transmission, thus eliminating the cable customarily used to connect the probes. The signal transmitted may be analog or digital. The transmitter and receiver may be plugged into the same jacks on the probe that were used for the cable. In parallel with the voltmeter and connected electrically with the shielding is an electrical circuit designed to add the capacitive current to a current detected by the probes in such a way that the net effect on the measured current is zero.

10 Claims, 3 Drawing Sheets

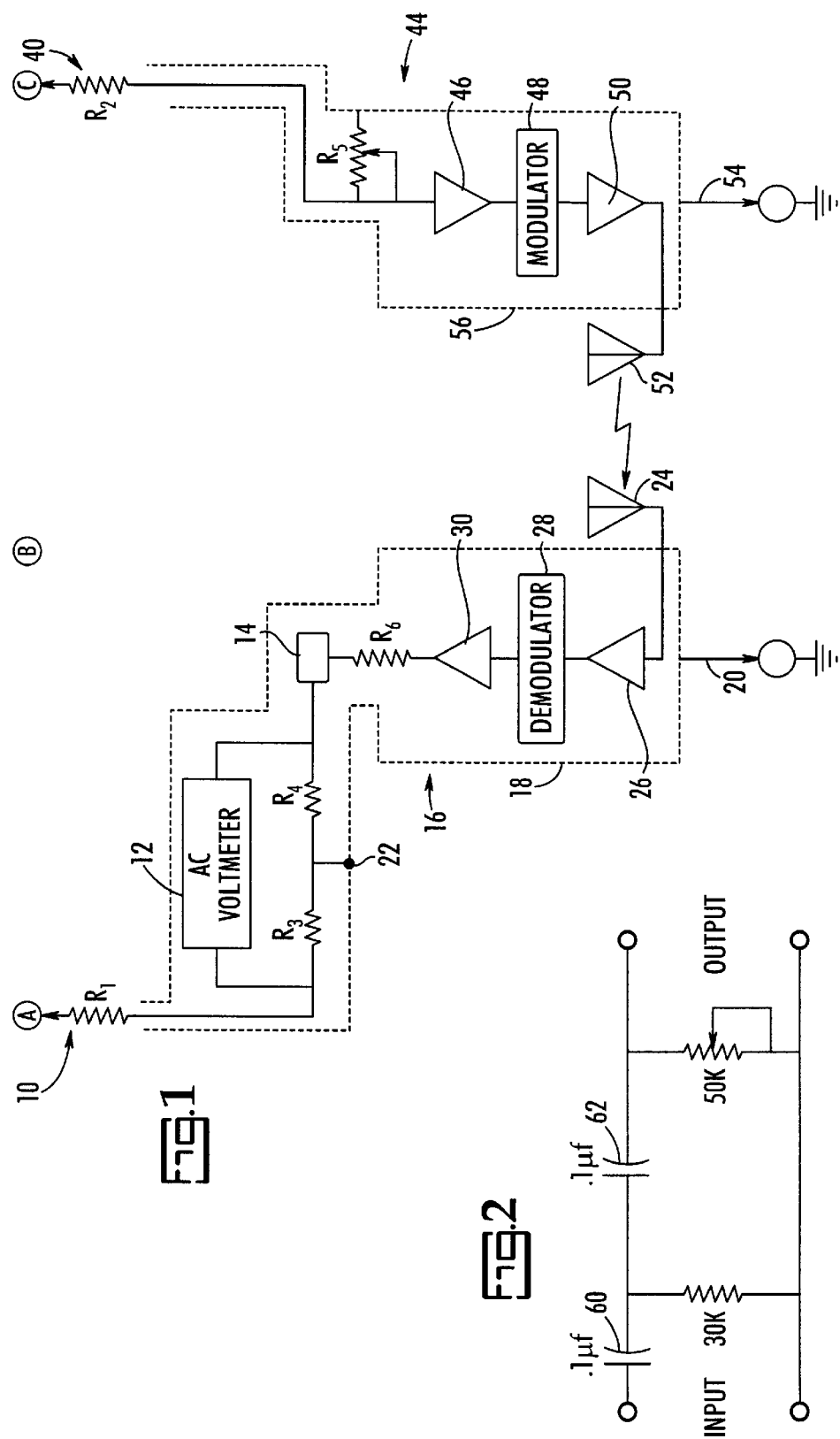

WIRELESS ALTERNATING CURRENT PHASING VOLTMETER

FIELD OF THE INVENTION

The present invention relates to voltmeters generally and to voltmeters for use in electrical power transmission line servicing and maintenance in particular.

BACKGROUND OF THE INVENTION

Electricity transmitted through power lines destined for commercial, industrial and residential use can involve hundreds of thousands of volts and high currents. Inevitably, there is an element of danger in measuring the voltage on a transmission line because of the need to make contact with the line. Indeed, even the proximity to a high voltage line may be sufficient to cause a spark to jump through the air to the nearest object. Nonetheless, in installing, servicing and repairing power lines, there are various occasions when contact is made, such as when the voltage carried by a line must be measured.

The circumstances and equipment used for measurements of the voltage of transmission lines varies considerably. For example, the absolute voltage carried by a line may be measured by a "high line resistive voltmeter." As another example, in servicing or repairing voltage regulators, an "off neutral detector" is used to determine if the regulator is passing current or has been effectively isolated from the power source. In still another application, a "phasing voltmeter" is customarily used in connecting individual lines of the multi-phase transmission power lines. The phasing voltmeter helps to prevent two lines that are not in phase from being connected inadvertently.

Presently, high voltage phasing voltmeters use two test probes, which are each high voltage resistors housed in an insulated holder, in series with each other and a meter and a cable. The test probes are connected to the series cable and the series meter. The holders will have metal hooks or other fittings on their ends for good electrical contact with transmission lines. Often the meter is mounted to one of the two test probes and oriented so that the electric utility worker can read the voltage displayed on the meter. "Hot sticks" may be used to hold and elevate the entire assembly. The meter may be designed to measure either voltage or current, but its display indicates voltage. However, the indicated voltage is not always the true voltage difference for the four types of measurements listed above.

High voltage measurements are plagued with inaccuracies stemming from stray capacitive charging currents. At high voltages, these stray currents emanate from the surface of every component of the measuring device including the cable. The capacitive current is related to the capacitive reactance, Xc, which can range from several thousand ohms on up, depending on the position of the meter and cable with respect to the ground. Under extreme conditions, such as when the series cable is lying directly on the ground between two pad-mounted transformers, the value of the capacitive reactance can be very low. The resulting capacitive current can then equal or exceed the measured current. Moreover, the voltage measured by the meter varies depending on the location of the meter and cable.

However, the inaccuracies in phasing voltmeters attributable to capacitive currents are eliminated by the design disclosed and described in a commonly owned U.S. patent application, Ser. No. 09/766,254, filed Jan. 18, 2001, which will be referred to herein as the "companion specification."

Other problems with phasing voltmeters have not been solved. On occasion, the two power transmission lines are separated by a considerable distance. While the alternating current phasing voltmeter disclosed in the related application practically eliminates capacitive currents regardless of the length of the cable, it does not effectively address the problem of the logistics in dealing with a long cable or the problem of having a cable that is not long enough.

There are other problems with phasing voltmeters. When very high voltages are being measured, the inherent dangers of applying the insulated test probes with a connecting cable to the lines create a natural reluctance to proceed.

These devices are used in the out of doors, during all types of weather and at all times of the day; therefore, being able to extract the indicated voltage is not always easy to do or, in fact, is it done accurately.

Thus there remains a need for a phasing voltmeter that is accurate regardless of the capacitive current, easy to read, and can be easily used when the transmission lines are separated by more than a few feet.

SUMMARY OF THE INVENTION

According to its major aspects and briefly recited, the present invention is a wireless phasing voltmeter where the capacitive currents are combined with the primary voltage measurement of the electrical transmission lines in such a way that the capacitive current has no net affect on the voltage measured regardless of the magnitude of the capacitive current. The voltage signal is transmitted using radio frequencies from one test probe to the voltmeter and the output of the voltmeter may be displayed digitally. Thus, the meter can be applied to transmission lines a considerable distance apart without being limited by the length of a cable.

The present phasing voltmeter includes a pair of test probes in series with a high impedance alternating current (AC) voltmeter, a radio frequency transmitter, and a radio frequency receiver. In parallel with the voltmeter is a low impedance electrical circuit, tied electrically at a single point of contact to electrical shielding surrounding and electrically isolating the resistors, AC voltmeter, transmitter and receiver. The shielding picks up the capacitive currents in the vicinity of the phasing voltmeter.

The purpose of the electrical circuit is described in the companion specification. Furthermore, a number of different embodiments of this electrical circuit are described in the companion specification, but, for convenience, only a gain and a balance resistor will be illustrated and described for use with the present invention, however, it will be understood that any of those described in the companion specification may be used with the present invention, In addition to the high impedance resistors, voltmeter, transmitter, receiver and electrical circuit, a phase shift network may optionally, but preferably, be added to account for the shift in the phase that occurs. Also, the present wireless AC phasing voltmeter may process and transmit the measured voltage digitally to provide an alternative way to transmit the signal from the second probe.

An important feature of the present invention is the use of radio frequency transmitter and receiver to transmit the signal from one of the high impedance resistors to the voltmeter. This feature has several advantages. First, it eliminates the cable, which, in addition to the cost and the requirement to manage it as part of the voltmeter, imposes a significant physical limitation on the distance between the two high impedance resistors. Second, it allows measurements of the voltage difference between two power transmission lines that may be very far apart. Third, it reduces the natural trepidation of workers who are responsible for making measurement on transmission lines carrying very large voltages. Although any electromagnetic waves (visible, infra-red, radio-frequencies, microwave, for example) can be used, radio-frequencies are preferred because they allow for other objects to be in the line of sight between transmitter and receiver without loss of signal. Preferably the signals are transmitted digitally and in such a way as to minimize the effect of electrical noise on the transmission, such as by frequency shift keying.

Another feature of the present invention is that current phasing voltmeters can be backfitted to use a transmitter and a receiver instead of a cable. Currently, the cable has jacks on each end that plug into the voltmeter and the other test probe. The present transmitter and receiver can be made with jacks that plug into the same plugs the cable would use.

Still another feature of the present invention is the inclusion of a phase shift network to eliminate a small error that is introduced by the modulation and demodulation of the electrical signal.

These and other features and their advantages will be apparent to those skilled in the art of transmission line voltage measurement from a careful reading of the Detailed Description of Preferred Embodiments accompanied by the following drawings.

BRIEF DESCRIPTION OF THE DRAWINGS

In the figures,

FIG. 1 is a schematic illustration of a wireless phasing voltmeter according to a preferred embodiment of the present invention;

FIG. 2 is a detail of the wireless phasing voltmeter of FIG. 1 showing the phase shift network.

DETAILED DESCRIPTION OF PREFERRED EMBODIMENTS

Figure 3:
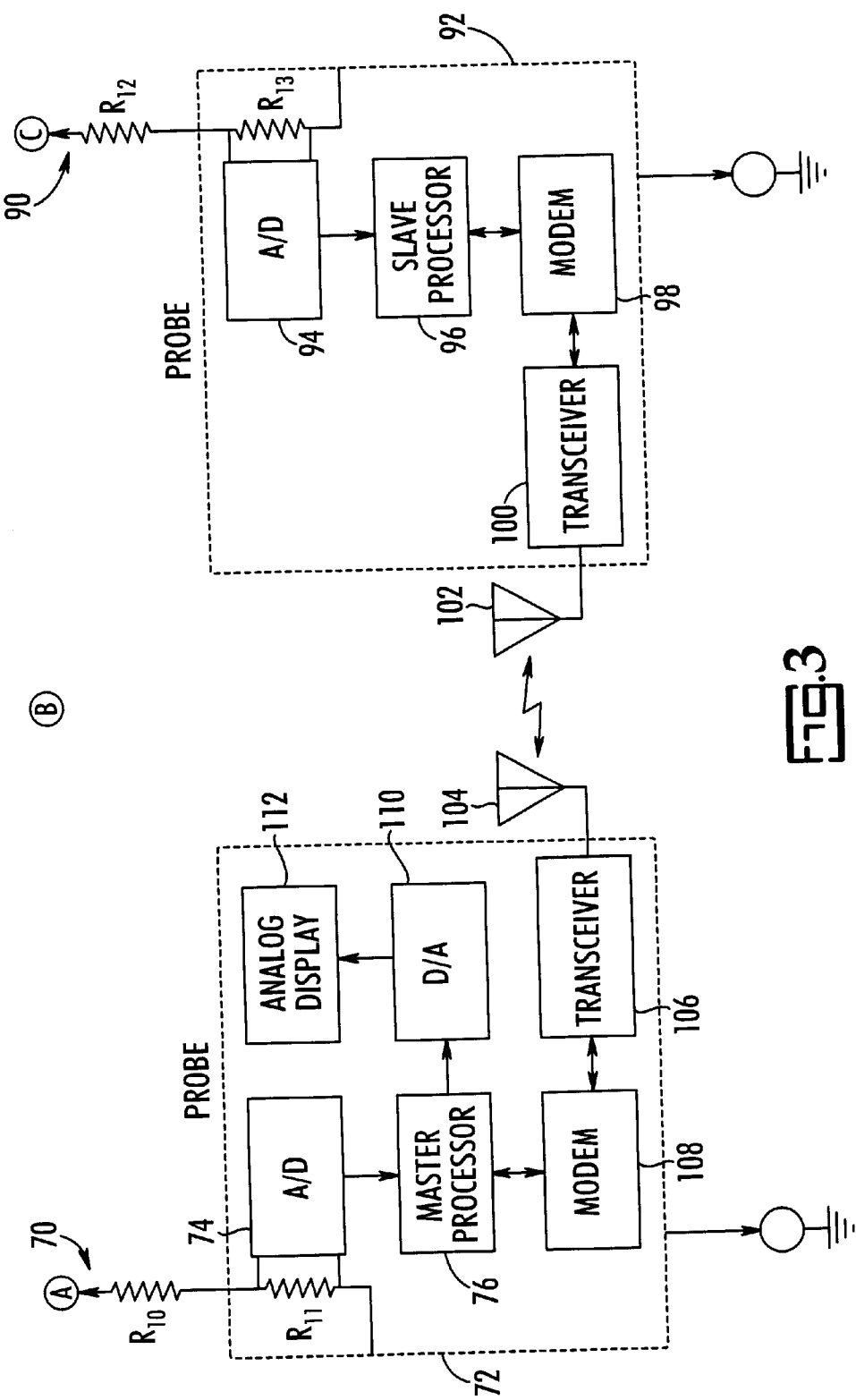
FIG. 3 is another embodiment of the wireless phasing voltmeter, according to an alternative preferred embodiment of the present invention.

The present invention is a phasing voltmeter that is an improvement over existing phasing voltmeters. Preferably, it employs the electrical circuit in the companion specification identified above, which specification is hereby incorporated herein by reference.

Referring now to the figures, FIG. 1 illustrates schematically a circuit diagram of an embodiment of the present invention being used to measure the voltage difference between conductors A and C of an energized, three-phase transmission line. A first high impedance resistor R1 is located in a first test probe 10 and connected in series with an alternating current (AC) voltmeter 12. Preferably, a phase shift network 14 is connected in series with voltmeter 12, and located between voltmeter 12 and a radio frequency receiver 16.

Shielding 18 surrounds and electrically isolates voltmeter 12, phase shift network 14 and receiver 16 and much of first test probe 10. A ground lead 20 preferably is used to ground shielding 18.

In addition, shielding 18 is also connected to a point 22 between two resistors R3 and R4 that are in series with each other and in parallel with voltmeter 12. These are, respectively, the gain and balance resistors, whose function is described in detail in the companion specification and serve to add the capacitive current to the voltage difference being measured in such a way that the vector addition of the capacitive current has no impact on the magnitude of the measured voltage difference.

Receiver 16 includes an antenna 24 to detect radio frequency signals, a radio frequency amplifier 26 to amplify the detected signals, and frequency demodulator 28 to demodulate the detected signal, a 60 hertz amplifier 30 and a resistor R6.

At an arbitrary distance from first test probe 10, but preferably within range of receiver 16, is a second test probe 40 with a second high impedance resistor R2 connected to a radio frequency transmitter 44. Transmitter 44 and receiver 16 are able to transmit and receive the same carrier frequency and modulate the carrier, preferably using a technique of applying a signal to a carrier wave that can be detected in spite of electrical noise, such as frequency modulation (FM).

Transmitter 44 includes a 60 hertz amplifier 46, a frequency modulator 48, a radio frequency amplifier 50 and an antenna 52. Transmitter 44 also preferably has a ground lead 54 and is tied electrically to shielding 56 covering and isolating much of second test probe 40 and transmitter 44 through an adjustable resistor R5.

The signal detected by second probe 40 from 60 cycle power transmission conductor C using resistor R2 and R5 in a voltage divider network is amplified by 60 hertz amplifier 46 and used by modulator 48 to modulate a radio frequency carrier wave supplied by modulator 48. As in any frequency modulated signal, the peak frequency swing of the transmitter is a function of the peak voltage applied and may be expressed in terms of volts per kilocycle of deviation. The rate at which the peaks of deviation occur is a function of the applied frequency (60 Hz). The 60 Hz modulating frequency would be phase locked to the applied voltage from the input voltage divider network (R2 and R5). The modulator output is fed to radio frequency amplifier 50 and then to antenna 52.

Antenna 24 picks up the signal from antenna 52, amplifies it with radio frequency amplifier 26, removes the 60 hertz signal from the radio frequency carrier wave using demodulator 28, and amplifies the extracted 60 cycle signal with 60 hertz amplifier 30. The gain of amplifier 30 may be set to establish a new voltage divider network consisting of R6 and R4, to cause the original voltage signal from voltage divider network R2, R5, to be reproduced across R4.

Optionally, but preferably, phase shift network 14 is inserted between voltmeter 12 an receiver 16.

Phase shift network 14, illustrated in FIG. 2, is composed of two resistor/capacitor (RC) combinations in series. In a typical high voltage AC phasing voltmeter for use in measuring voltage differences in 60 Hz conductors, both have 0.1 microfarad capacitors 60 and 62, but the first has a 30K resistor and the second has an adjustable 50K resistor. The purpose of the phase shift network 14 is to correct for a shift in phase, by about 70 degrees. While not wishing to be bound by theory, it is believed that the cause of the phase shift is the modulation and demodulation of the signal. The distance between receiver 16 and transmitter 44 does not seem to be a factor in causing the phase shift.

In an alternate preferred embodiment of the present invention, illustrated in FIG. 3, a first probe 70 is used to detect voltage from conductor A of a three phase power transmission system having conductors A, B, and C. As before, a high impedance resistor R10 is used to drop the voltage. A second, preferably adjustable resistor R11 drops the voltage still further and tied electrically to a grounded shield 72. The ratio of the resistances of R10 to R11 is preferably approximately 1,000,000 to one. In a 100,000 volt power line, the voltage across R11 would be 0.1 volts. The voltage across R11 is converted from an analog signal to a digital signal by analog-to-digital converter 74 and fed to master processor 76. Master processor 76 manages the flow of digital data from two sources, converter 74 and a modem 108, described below, processes the signals from these two sources and forwards them for display.

A second probe 90, spaced apart from first probe 70, but within range, detects the voltage signal carried by C and drops that voltage significantly across R12, a high impedance resistor. As in first probe 70, the ratio of the resistance of R12 to R13 is preferably approximately 1,000,000 to one. The voltage is dropped further across resistor R13, which is tied electrically to a grounded shield 92. An analog-to-digital converter 94 converts the analog voltage drop across R13 to a digital signal and passes it to a slave processor 96. The digitized signal from the slave processor 96 is transmitted using a modem 98, a transceiver 100, and an antenna 102. The digitized signal may be transmitted by frequency modulation, amplitude modulation, phase modulation, or by frequency shift keying, the last of these being preferred and all of which are well known techniques for transmitting digital signals.

Figure 4:
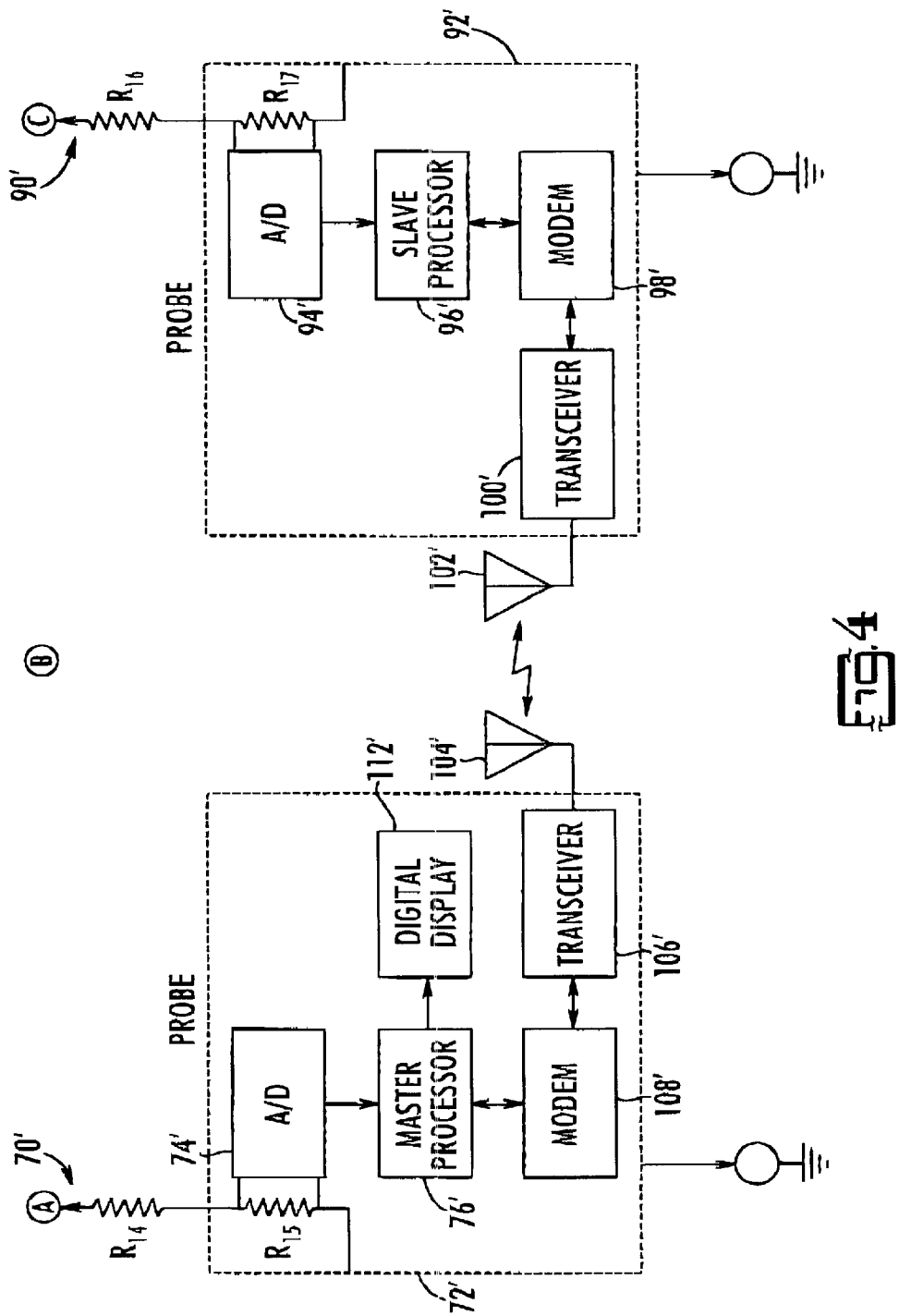
FIG. 4 is another embodiment of the wireless phasing voltmeter, according to an alternative preferred embodiment of the present invention.

The signal is picked up by an antenna 104 and forwarded to master processor 76 via a transceiver 106 and modem 108, which demodulates the signal. The signals are processed to extract the voltage difference, which may be converted back to analog by a digital-to-analog converter 110 for analog display on display 112, or left to be displayed digitally on digital display 112', as shown in FIG. 4.

Ground leads of the embodiments of FIGS. 1 and 2 may be eliminated but with an attendant loss in accuracy. With them, the present phasing voltmeter is accurate to ±1%; without them, the voltmeter is accurate only to ±10%.

The use of radio frequencies is convenient and makes it possible to transmit through or around obstacles that might hinder line-of-sight transmissions such as visible light, infrared and possibly microwave transmissions. However, these other forms of electromagnetic waves could also be used. Also, the use of frequency modulation is preferred because of its resistance to noise but amplitude modulation is also possible. Finally, it will be apparent to those skilled in the art of electrical power transmission line servicing and maintenance equipment design that many other modifications and substitutions can be made to the foregoing preferred embodiments without departing from the spirit and scope of the present invention.

What is claimed is:

1. A device for use in measuring voltage, said device comprising:
    a first test probe having
        means for detecting a first voltage
        means for generating a first signal proportional to said first voltage,
        means for receiving a second signal
        means for processing said first signal and said second signal in order to compare said first and said second signals to determine a difference between said first and said second signal, and
        means for displaying said difference as a voltage difference between said first voltage and said second voltage; and
    a second test probe responsive to said first test probe and having
        means for detecting a second voltage,
        means for generating said second signal, said second signal being proportional to said second voltage,
        means for transmitting, using electromagnetic waves, said second signal to said first probe.

2. The device as recited in claim 1, wherein said means for transmitting radio frequency waves.

3. The device as recited claim 1, wherein said means for transmitting transmits said second signal by a method selected from the group consisting of frequency shift keying, frequency modulation, phase modulation, and amplitude modulation.

4. The device as recited in claim 1, wherein said means for generating said second signal generates a digital second signal.

5. The device as recited in claim 1, wherein said means for generating said first signal generates a digital first signal.

6. method of measuring a voltage difference, comprising the steps of:
    determining a voltage carried by a first conductor;
    determine a voltage carried by a second conductor;
    generating a first electrical signal proportional to said voltage carried by said first conductor;
    generating a second electrical signal proportional to said voltage carried by said second conductor;
    transmitting said second electrical signal via electromagnetic waves;
    receiving said second electrical signal via electromagnetic waves;
    processing said first and said second electrical signals to determine a difference between said first and said second electrical signals; and
    displaying said difference as a voltage difference between said voltage carried by said first conductor and said voltage carried by said second conductor.

7. The method as recited in claim 6, wherein said electromagnetic waves are radio frequency waves.

8. The method as recited in claim 6, wherein said second electrical signal is used to modulate said electromagnetic waves.

9. The method as recited in claim 6, wherein said second electrical signal is used to modulate the frequency of said electromagnetic waves.

10. The method as recited in claim 6, further comprising the step of displaying said difference on a digital display.

* * * * *